(12) United States Patent  (10) Patent No.: US 8,911,826 B2
Adachi et al.  (45) Date of Patent: Dec. 16, 2014

(54) METHOD OF PARALLEL SHIFT OPERATION OF MULTIPLE REACTORS

(75) Inventors: Wataru Adachi, Yokohama (JP); Jeongsok Ha, Hachioji (JP)

(73) Assignee: ASM IP Holding B.V., Almere (NL)

( * ) Notice: Subject to any disclaimer, the term of this patent is extended or adjusted under 35 U.S.C. 154(b) by 36 days.

(21) Appl. No.: 13/565,564

(22) Filed: Aug. 2, 2012

(65) Prior Publication Data

US 2014/0033978 A1  Feb. 6, 2014

(51) Int. Cl.
*C23C 16/52* (2006.01)
*F17D 3/00* (2006.01)

(52) U.S. Cl.
USPC ........................................ 427/248.1; 118/719

(58) Field of Classification Search
None
See application file for complete search history.

(56) References Cited

U.S. PATENT DOCUMENTS

| 2001/0028924 A1* | 10/2001 | Sherman ................... 427/255.28 |
| 2002/0110991 A1* | 8/2002 | Li ................................... 438/347 |
| 2003/0082307 A1* | 5/2003 | Chung et al. ................... 427/402 |
| 2004/0082171 A1* | 4/2004 | Shin et al. ...................... 438/689 |
| 2005/0241763 A1* | 11/2005 | Huang et al. ............. 156/345.33 |
| 2005/0274323 A1* | 12/2005 | Seidel et al. ................... 118/719 |
| 2006/0137609 A1* | 6/2006 | Puchacz et al. ............... 118/719 |

* cited by examiner

*Primary Examiner* — Joseph Miller, Jr.
(74) *Attorney, Agent, or Firm* — Snell & Wilmer L.L.P.

(57) ABSTRACT

A method of parallel shift operation of multiple reactors includes: (i) continuously supplying n gases numbered 1 to n simultaneously to n gas ports via n main gas lines, respectively, at a constant flow rate, wherein one of branch gas lines of each main gas line is in an open state so that the inflow rates of the respective reactors are equal, and the outflow rates of the respective reactors are equal; and (ii) while maintaining the inflow rates and the outflow rates of the respective reactors, simultaneously closing the one of the branch gas lines of each main gas line in the open state and opening another one of the branch gas lines of each main gas line so that different numbered gases are continuously supplied to the respective reactors in parallel without changing the inflow rates and the outflow rates of the reactors.

19 Claims, 18 Drawing Sheets

FIG. 1

|  | Step 1 | Step 2 | Step 3 | Step 4 |
|---|---|---|---|---|
|  | Precursor feeding | Purge | Plasma treatment | Purge |
| Precursor | Precursor flow | | | |
| Reactant | flow | | | |
| RF plasma | off | | on | |

FIG. 2

|  | Step 1 | Step 2 | Step 3 | Step 4 |
|---|---|---|---|---|
|  | Precursor feeding | Purge | Plasma treatment | Purge |
| Precursor | Precursor flow | | Inactive gas flow | |
| Reactant | flow | | | |
| RF plasma | off | | on | |

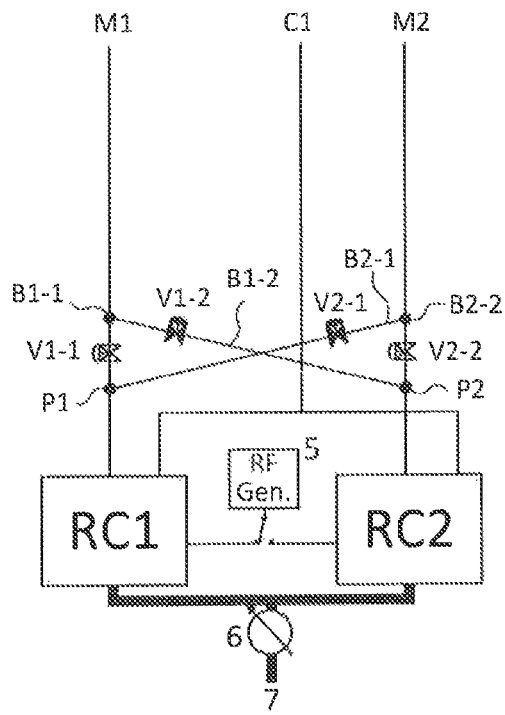
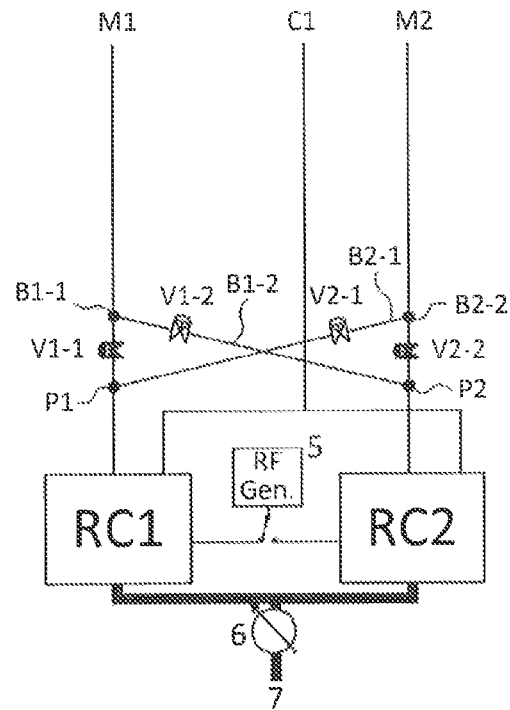
FIG. 13A    FIG. 13B
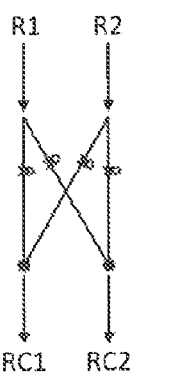 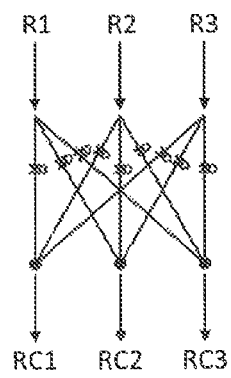 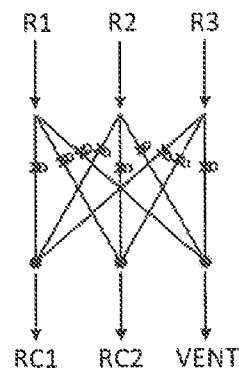 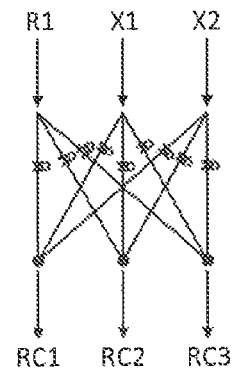
FIG. 14A    FIG. 14B    FIG. 14C    FIG. 14D

|          | Reactant1 flow   | Purge | Reactant2 flow    | Purge |
|----------|------------------|-------|-------------------|-------|
| Reactant1 | Reactant1 flow  |       | Inactive gas flow |       |
| Reactant2 | Inactive gas flow |     | Reactant2 flow    |       |

A: Reactant A, B: Reactant B, X: Purge gas, Y: Purge gas

METHOD OF PARALLEL SHIFT OPERATION OF MULTIPLE REACTORS

BACKGROUND

1. Field of the Invention

The present invention generally relates to a semiconductor-manufacturing method, particularly to a method of parallel shift operation of multiple reactors wherein gases are continuously supplied to the reactors.

2. Description of the Related Art

A plasma-enhanced atomic layer deposition (PEALD) process typically repeats the following four steps as illustrated in FIG. 1:

In step 1 (Precursor feeding), a precursor gas is supplied into a reactor chamber (RC) and the precursor is adsorbed onto a wafer surface. In step 2 (Purge), non-adsorbed precursor is removed from the reactor chamber. In step 3 (Plasma treatment), the adsorbed surface is activated by RF plasma for reaction of the precursor with a reactant gas. In step 4 (Purge), non-reacted precursor and by-products are removed from the surface. In the above, during the steps, the reactant gas continuously flows. Equipment for the PEALD process requires the following components as illustrated in FIG. 3:

An RF generator (single or dual frequency): 1 device (4)/1 RC;

A precursor gas line: 1 line (1)/1 RC (if the process requires switching and flowing different precursors, a different line (2) is required for each precursor);

A reactant gas line: 1 line (3)/1 RC; and

An RC pressure control valve and exhaust line: 1 set (6, 7)/1 RC.

The required components must be changed when expanding the system from one RC to multiple RCs. By simple expansion, a two-RC system requires the following components as illustrated in FIG. 4:

An RF generator (single or dual frequency): 2 devices (4, 4')/2 RCs;

A precursor gas line: 2 lines (1, 1')/2 RCs (if the process requires switching and flowing different precursors, a different line is required for each precursor per RC);

A reactant gas line: 2 lines (3, 3')/2 RCs; and

An RC pressure control valve and exhaust line: 2 sets (6, 7, 6',7')/2 RCs.

Considering the above component redundancy, the system requirements can be modified, depending on the precursor supply system, the architecture of process sequence, and the process controllability between two RCs.

The precursor supply system is classified into the following two types:

(I) By on/off control of a precursor flow, precursor supply is controlled as illustrated in (I) in FIG. 5.

(II) By switching a precursor flow and an inactive gas flow while maintaining the same flow rate, precursor supply is controlled as illustrated in (II) in FIG. 5.

In the on-off flow control system, a liquid precursor is vaporized in a tank 41, a carrier gas is introduced into the tank 41 through a line 43, and when a valve 42 is closed, no flow goes out from the tank 41 through a line 44 as illustrated in (a) in FIG. 5. When the valve 42 is open, the carrier gas carries the vaporized precursor and flows out together from the tank 41 through the line 44 as illustrated in (b) in FIG. 5. By the on/off control of precursor flow, a total gas flow rate and an RC pressure become altered. Therefore, this flow control system is not adopted in the case where the RC pressure difference between RCs could cause a problem (e.g. improper precursor gas inflow goes to a wrong RC via a shared exhaust line due to the pressure difference between the RCs). In the switching flow control system, a liquid precursor is vaporized in a tank 51, a carrier gas is introduced into the tank 51 through a line 53 via a valve 56 since a valve 55 is closed. The carrier gas carries the vaporized precursor and flows out together from the tank 51 through a line 54 via a valve 57 as illustrated in (d) in FIG. 5. However, when the valve 55 is open, and the valves 56, 57 are closed, only the carrier gas flows through the lines 53, 54 as illustrated in (c) in FIG. 5. By switching a precursor and an inactive gas flow, a total flow rate and an RC pressure can substantially be fixed and an RC pressure is easily controlled by an automatic pressure controller (not shown). In this flow control system, since there is no substantial pressure difference between the RCs, although the RCs share an exhaust line, there is substantially no interplay between the RCs. A typical process sequence using the switching flow control system is illustrated in FIG. 2. The difference from the process sequence shown in FIG. 1 is that in steps 2, 3, and 4, upon switching from the precursor to the inactive gas, the inactive gas flows continuously from step 1 at the same flow rate as that of the precursor in step 1.

The architecture of process sequence is classified into the following two types:

(1) Concurrent processing between RC1 and RC2 as illustrated in (1) in FIG. 6;

(2) Alternate processing between RC1 and RC2 as illustrated in (2) in FIG. 6.

Concurrent processing is simple. In a PEALD process, the alternate processing can be selected to reduce system components by eliminating duplicate (simultaneous timing) operation of a single resource used only in a specific step. For example, by eliminating overlapping plasma treatment between two RCs, a single RF generator can be shared between the two RCs. In alternate processing, the same operation is conducted in two RCs alternately, wherein independent process step control is required for each of the RCs.

The process controllability between two RCs is classified into the following two types according to whether different processing cycles between two RCs can or cannot be set.

(A) Different processing cycles between two RCs can be set;

(B) Different processing cycles between two RCs cannot be set (only the same processing cycles can be set).

There are some advantages of setting the different processing cycles between two RCs. First, processes under different conditions (e.g., film thickness) of deposition can be performed simultaneously at the respective RCs. Second, an RC-to-RC mismatch can be adjusted by setting different processing cycles between the RCs. It should be noted that the system capable of alternate processing is naturally able to process different cycles between two RCs since independent process step control is required for each of the RCs capable of alternate processing.

The precursor supply system ((I): on-off flow control system; (II): switching flow control system), the architecture of process sequence ((1): concurrent processing; (2): alternate processing), and the process controllability between two RCs ((A): different cycles; (B): identical cycles) can be combined in multiple ways.

FIG. 7 illustrates a two-reactor system with an on-off flow control system (I), concurrent processing (1), and the capability of different cycles (A), wherein a precursor line 1, a precursor line 2, and a reactant gas line 3 are shared by a reaction chamber 4 and a reaction chamber 4'. However, in order to have the capability of different cycles between the reaction chambers 4, 4', different RF generators 5, 5', different pressure control valves 6, 6', and different exhaust lines 7, 7' are provided to the reaction chambers 4, 4', respectively.

FIG. 8 illustrates a two-reactor (two-RC) system with an on-off flow control system (I), concurrent processing (1), and incapability of different cycles (B), wherein a precursor line 1, a precursor line 2, a reactant gas line 3, a pressure control valve 6, and an exhaust line 7 are shared by a reaction chamber 4 and a reaction chamber 4'. Although an RF generator can be shared by the reaction chambers 4, 4', different RF generators 5, 5' are used to ensure the same effective power between RCs. Since the process is concurrent without the capability of different cycles, all of the components (except for the RF generators) can be shared by the two reaction chambers.

FIG. 9 illustrates a two-reactor (two-RC) system with the on-off flow control system (1) and alternate processing (2), wherein a precursor line 1, a precursor line 2, and a reactant gas line 3 are shared by a reaction chamber 4 and a reaction chamber 4'. In order to perform alternate processing, the flows of gases are controlled by on-off valves 8, different pressure control valves 6, 6', and different exhaust lines 7, 7' are provided to the reaction chambers 4, 4', respectively. Although different RF generators can be used in the reaction chambers 4, 4', an RF generator 5 provided with a switch for switching the reaction chambers 4, 4' is shared by the reaction chambers 4, 4'.

FIG. 10 illustrates a two-reactor (two-RC) system with a switching flow control system (II), concurrent processing (1), and capability of different cycles (A), wherein a reactant gas line 3 is shared by a reaction chamber 4 and a reaction chamber 4'. In order to perform different cycles between the reaction chambers 4, 4', different precursor/inactive gas lines 11, 11' (with a fixed flow rate), different precursor/inactive gas lines 12, 12' (with a fixed flow rate), and different RF generators 5, 5' are provided to the reaction chambers 4, 4', respectively. Regardless of whether the cycles are different between the reaction chambers 4, 4', the total flows of gases of the reaction chambers 4, 4' are the same because of the switching flow control system (i.e., the flow rate is fixed), and thus, a pressure control valve 6 and a exhaust line 7 are shared by the reaction chambers 4, 4'.

FIG. 11 illustrates a two-reactor (two-RC) system with a switching flow control system (II), concurrent processing (1), and incapability of different cycles (B), wherein a precursor/inactive gas line 11 (with a fixed flow rate), a precursor/inactive gas line 12 (with a fixed flow rate), a reactant gas line 3, a pressure control valve 6, and a exhaust line 7 are shared by a reaction chamber 4 and a reaction chamber 4'. Although an RF generator can be shared by the reaction chambers 4, 4', different RF generators 5, 5' are used to ensure the same effective power between RCs. Since the process is concurrent without the capability of different cycles, all of the components (except for the RF generators) can be shared by the two reaction chambers.

FIG. 12 illustrates a two-reactor (two-RC) system with a switching flow control system (II) and alternate processing (2), wherein a reactant gas line 3 is shared by a reaction chamber 4 and a reaction chamber 4'. In order to perform alternate processing in the reaction chambers 4, 4', different precursor/inactive gas lines 11, 11' (with a fixed flow rate), and different precursor/inactive gas lines 12, 12' (with a fixed flow rate) are provided to the reaction chambers 4, 4', respectively. Regardless of whether the processing is performed in the reaction chambers 4, 4' alternately, the total flows of gases of the reaction chambers 4, 4' are the same because of the switching flow control system (i.e., the flow rate is fixed), and thus, a pressure control valve 6 and an exhaust line 7 are shared by the reaction chambers 4, 4'. Although different RF generators can be used in the reaction chambers 4, 4', an RF generator 5 provided with a switch for switching the reaction chambers 4, 4' is shared by the reaction chambers 4, 4'.

Table 1 below summarizes the above combinations and the required minimum components.

TABLE 1

| Combination | FIG. | RF generator | Precursor line per precursor | Reactant gas line | RC pressure control valve and exhaust line |
|---|---|---|---|---|---|
| (I)-(1)-(A) | 7 | 2 sets/2 RCs | 1 sets/2 RCs | 1 sets/2 RCs | 2 sets/2 RCs |
| (I)-(1)-(B) | 8 | 2 sets/2 RCs | 1 sets/2 RCs | 1 sets/2 RCs | 1 sets/2 RCs |
| (I)-(2) | 9 | 1 sets/2 RCs | 1 sets/2 RCs | 1 sets/2 RCs | 2 sets/2 RCs |
| (II)-(1)-(A) | 10 | 2 sets/2 RCs | 2 sets/2 RCs | 1 sets/2 RCs | 1 sets/2 RCs |
| (II)-(1)-(B) | 11 | 2 sets/2 RCs | 1 sets/2 RCs | 1 sets/2 RCs | 1 sets/2 RCs |
| (II)-(2) | 12 | 1 sets/2 RCs | 2 sets/2 RCs | 1 sets/2 RCs | 1 sets/2 RCs |

As shown in Table 1, in order to be capable of alternate processing (2) or different cycles (A), the system requires two sets of at least one of precursor lines or RC pressure control valves and exhaust lines.

The above examples are based on PEALD. However, any cyclic deposition (e.g., cyclic CVD, thermal ALD, radical-enhanced ALD, etc.) using multiple reaction chambers has similar problems in increasing the number of system components.

Further, in any cyclic deposition, film deposition processes based on chemical reaction typically use separate supply of reactant gas(es) during film deposition, because unwanted chemical reaction should be avoided between precursor and reactant gas(es), or because reactant gases need to be supplied separately for specific chemical reactions. For separate reactant gas supply, removing the reactant gas remaining in the reaction chamber before introducing another reactant gas is required. It requires additional transition time (e.g., >1 sec) at each and every reactant supply in order to remove the remaining reactant gas by purging the reaction chamber or pumping out the reaction chamber. Typically, the transition time includes stopping reactant gas supply, removing the remaining reactant gas by purging or pumping out the reaction chamber, and supplying and stabilizing a different reactant gas. Thus, changing gases increases process cycle time, lowering productivity. Further, since inactive gas is used for changing reactant gases and purging, the reactant gas is diluted by the inactive gas, and the partial pressure of the reactant gas is lowered, lowering chemical reaction speed.

FIG. 17 illustrates a conventional process sequence used for cyclic deposition using two reaction chambers based on concurrent processing, wherein the steps of supplying reactant gas A to each of reaction chambers 1 and 2, purging the reaction chambers 1 and 2, supplying reactant gas B to each of the reaction chambers 1 and 2, and then purging the reaction chambers 1 and 2, are repeated. FIG. 17 is overly simplified, and each supply pulse of reactant gas does not start and end as sharply as indicated in FIG. 17. The transition time and the dilution of reactant gas are unavoidable in conventional cyclic deposition. In this disclosure, the "reactant gas" refers to any gas participating in a chemical reaction of deposition or formation of a film, including a precursor in the broad sense. In the narrow sense, the "reactant gas" refers to any gas reacting with a precursor for deposition or formation of a film.

Any discussion of problems and solutions involved in the related art has been included in this disclosure solely for the purposes of providing a context for the present invention, and should not be taken as an admission that any or all of the discussion were known at the time the invention was made.

SUMMARY

Some embodiments provide a method of parallel shift operation of multiple reactors (also referred to as "reaction chambers") in which substrates are placed, which is capable of reducing the number of system components and also is capable of significantly reducing the transition time. The "parallel shift operation" refers broadly to non-concurrent operation which includes operation shifting from one reactor to another. The parallel shift operation includes alternate processing with the capability of different cycles between two reactors. In some embodiments, the method is performed using an apparatus wherein n main gas lines numbered 1 to n and n gas ports numbered 1 to n are provided wherein n is an integer greater than one, each main gas line branches into n branch gas lines numbered 1 to n connected to the n gas ports, respectively, each branch gas line is provided with a valve for closing and opening the branch gas line, and each reactor is connected to a different gas port, wherein at least one (but not all), typically one, of branch gas lines 1 to n of each main gas line is in an open state at a time while all the other branch gas lines of the main gas line are in a closed state. The number n is determinable by a skilled artisan based on routine work, depending on how many discrete gases must be used for deposition. For example, n is any integer of 2, 3, 4, 5, or 6. The number of reactors is also determinable by a skilled artisan based on routine work, depending on the number n (the number of reactors does not exceed the number n) and the productivity. In some embodiments, the number n is equal to the sum of the number of reactors and the number of vents (which bypasses reactors and are connected to an exhaust). In some embodiments, the method comprises:

(i) continuously supplying n gases numbered 1 to n simultaneously to the n gas ports via the n main gas lines, respectively, at a constant flow rate, wherein one of the branch gas lines of each main gas line is in an open state, said one of the branch gas lines being such that the inflow rates of the respective reactors are equal, and the outflow rates of the respective reactors are equal; and (ii) while maintaining the inflow rates and the outflow rates of the respective reactors, simultaneously closing the one of the branch gas lines of each main gas line in the open state and opening another one of the branch gas lines of each main gas line so that different numbered gases are continuously supplied to the respective reactors in parallel without changing the inflow rates and the outflow rates of the reactors.

In some embodiments, although the main gas line and the exhaust line are shared by the reactors, parallel shift operation or alternate processing can be performed with substantially no transition time. In some embodiments, the operation of the multiple reactors is cyclic CVD or ALD (e.g., pulsed plasma-enhanced CVD, thermal ALD, plasma-enhanced ALD, or radical-enhanced ALD).

Also, some embodiments provide a semiconductor-processing apparatus which is capable of performing any of the disclosed methods, comprising:

multiple reactors;

n main gas lines numbered 1 to n and n gas ports numbered 1 to n, wherein n is an integer greater than one, each main gas line branches into n branch gas lines numbered 1 to n connected to the n gas ports, respectively, each branch gas line is provided with a valve for closing and opening the branch gas line, and each reactor is connected to a different gas port, wherein one of branch gas lines 1 to n of each main gas line is in an open state at a time while all the other branch gas lines of the main gas line are in a closed state; and a common exhaust shared by the reactors.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 1 illustrates a process sequence used for typical plasma-enhanced atomic layer deposition (PEALD) using an on-off flow control system.

FIG. 2 illustrates a process sequence used for typical plasma-enhanced atomic layer deposition (PEALD) using a switching flow control system.

FIG. 13A is a schematic diagram illustrating parallel shift operation of PEALD using two reactors according to an embodiment of the present invention.

FIG. 13B is a schematic diagram illustrating the parallel shift operation of PEALD after changing the gases according to an embodiment of the present invention.

FIGS. 14A to 14D are schematic diagrams illustrating modifications of the parallel shift operation according to an embodiment of the present invention.

FIGS. 25 to 28 represent steps corresponding to feeding of reactor RC1, purging, feeding of reactor RC2, and purging, respectively.

DETAILED DESCRIPTION OF EMBODIMENTS

Figure 3:
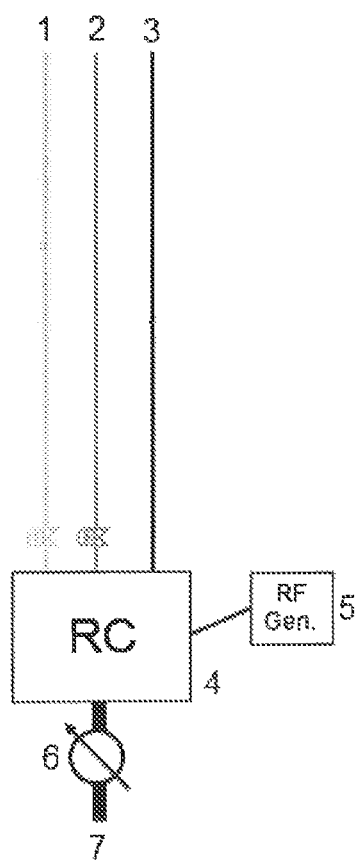
FIG. 3 is a schematic view of a conventional PEALD apparatus comprising one reactor chamber.
Figure 4:
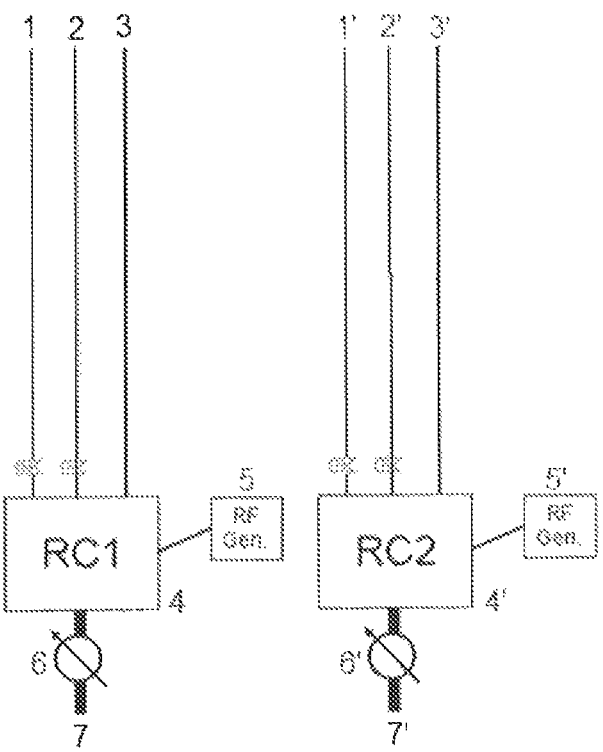
FIG. 4 is a schematic view of a conventional PEALD apparatus comprising two reactor chambers.

In this disclosure, "gas" may include vaporized solid and/or liquid and may be constituted by a single gas or a mixture of gases. In this disclosure, "a" refers to a species or a genus including multiple species. Further, in this disclosure, any two numbers of a variable can constitute an workable range of the variable as the workable range can be determined based on routine work, and any ranges indicated may include or exclude the endpoints. Additionally, any values of variables indicated may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

As described above, some embodiments provide a method of parallel operation of multiple reactors in which substrates are placed, wherein n main gas lines numbered 1 to n and n gas ports numbered 1 to n are provided wherein n is an integer greater than one, each main gas line branches into n branch gas lines numbered 1 to n connected to the n gas ports, respectively, each branch gas line is provided with a valve for closing and opening the branch gas line, and each reactor is connected to a different gas port, wherein one of branch gas lines 1 to n of each main gas line is in an open state at a time while all the other branch gas lines of the main gas line are in a closed state, which method comprises: (i) continuously supplying n gases numbered 1 to n simultaneously to the n gas ports via the n main gas lines, respectively, at a constant flow rate, wherein one of the branch gas lines of each main gas line is in an open state, said one of the branch gas lines being such that the inflow rates of the respective reactors are equal, and the outflow rates of the respective reactors are equal; and (ii) while maintaining the inflow rates and the outflow rates of the respective reactors, simultaneously closing the one of the branch gas lines of each main gas line in the open state and opening another one of the branch gas lines of each main gas line so that different numbered gases are continuously supplied to the respective reactors in parallel without changing the inflow rates and the outflow rates of the reactors.

In the above, "continuously" refers to without interruption as a timeline, without changing physical conditions, immediately thereafter, or without intervening steps. In the present disclosure, "constant", "equal", "the same" or the like includes substantially constant, equal, the same or the like, and equivalents thereof, e.g., the difference is as functionally immaterial, negligible, or non-detectable as a skilled artisan would appreciate. Further, "reactor" or "reaction chamber" refers to a chamber for reaction regardless of the number of sections or compartments constituting the chamber, including a dual chamber, which are not separately or independently controllable.

In some embodiments, the method further comprises repeating step (ii) in sequence until a film is formed on a substrate.

In some embodiments, in step (i), the branch gas lines in the open state are branch gas lines 1 to n corresponding to main gas lines 1 to n, respectively, and in step (ii), the branch gas lines to be opened are the next numbered branch gas lines corresponding to main gas lines 1 to n, respectively, wherein the next number after number n returns to number 1.

Figure 22:
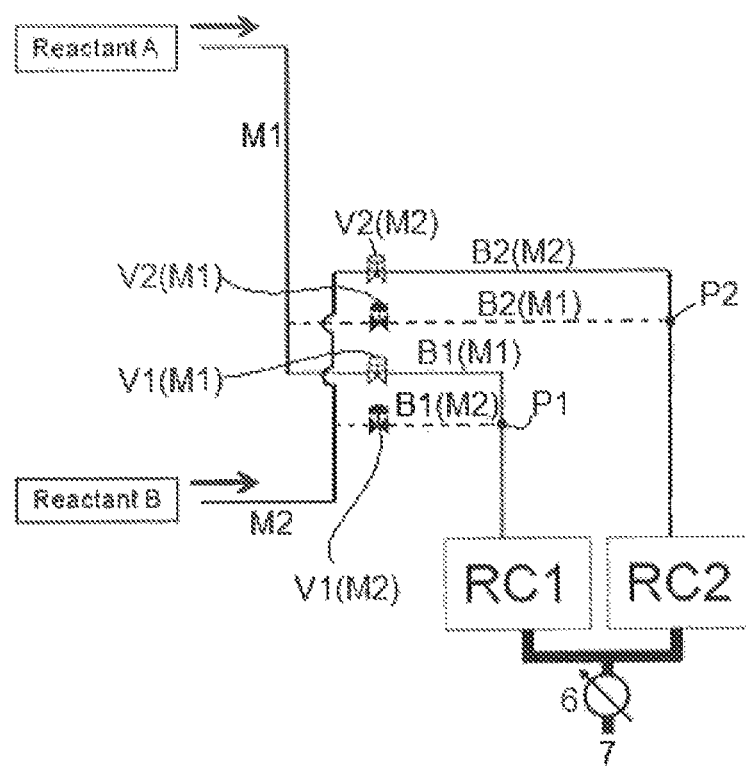
FIG. 22 is a schematic diagram illustrating a system of parallel shift operation where reactants A and B are supplied to reaction chambers RC1 and RC2, respectively, according to an embodiment of the present invention.

FIG. 22 is a schematic diagram illustrating a system of parallel shift operation where reactants A and B are supplied to reaction chambers RC1 and RC2, respectively, according to some embodiments. In this figure, two main gas lines M1, M2 and two gas ports P1, P2 are provided wherein each main gas line branches into two branch gas lines B1, B2 connected to gas ports P1, P2, respectively, branch gas lines B1 (M1) (i.e., branch gas line B1 connected to main gas line M1), B1 (M2), B2 (M1), and B2 (M2) are provided with valves V1 (M1), V1 (M2), V2 (M1), and V2 (M2), respectively, for closing and opening the corresponding branch gas line, and reaction chambers RC1, RC2 are connected to gas ports P1, P2, respectively, wherein valves V1 (M1) and V2 (M2) are in an open state while valves V1 (M2) and V2 (M1) are in a closed state. Reactants A, B are continuously supplied simultaneously to gas ports P1, P2, via main gas lines M1, M2, respectively, at a constant flow rate, wherein valves V1 (M1), V2 (M2) are in an open state so that the inflow rates of reaction chambers RC1, RC2 are equal, and the outflow rates of the respective reactors are equal. The gases are discharged through a single pressure control valve 6 to a single exhaust 7.

Figure 18:
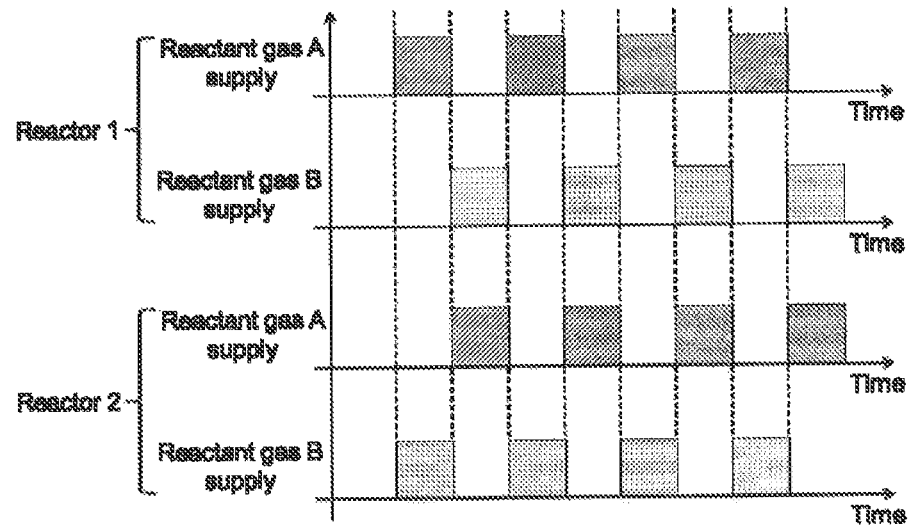
FIG. 18 illustrates process sequences of parallel shift operation in two reactors according to an embodiment of the present invention.
Figure 23:
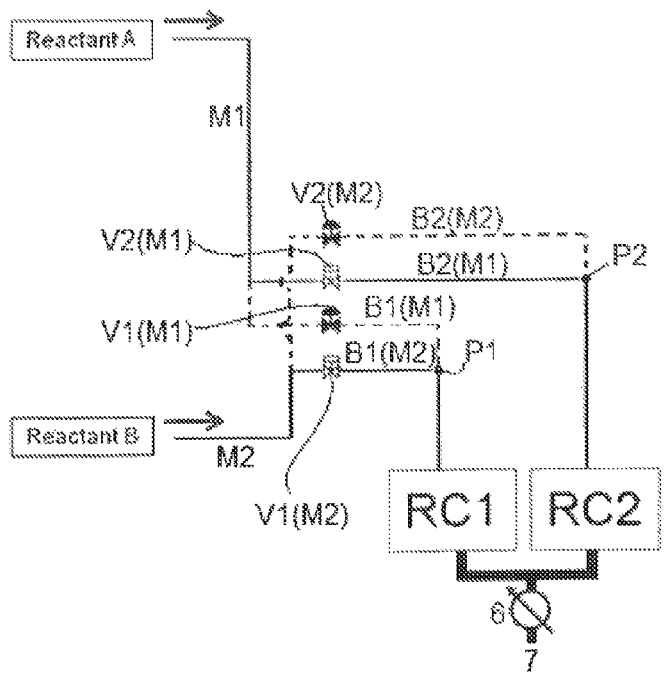
FIG. 23 is a schematic diagram illustrating the system of parallel shift operation where reactants A and B are supplied to reaction chambers RC2 and RC1, respectively, according to an embodiment of the present invention.

FIG. 23 is a schematic diagram illustrating the system of parallel shift operation where reactants A and B are supplied to reaction chambers RC2 and RC1, respectively, according to some embodiments. In this figure, while maintaining the inflow rates and the outflow rates of the respective reactors, valves V1 (M1), V2 (M2) in the open state are closed and valves V1 (M2), V2 (M1) are opened simultaneously so that reactants A, B are switched and continuously supplied to reaction chambers RC2, RC1, respectively, in parallel without changing the inflow rates and the outflow rates of the reactors. FIG. 18 illustrates process sequences of the above parallel shift operation. Reactant A is supplied first to reactor 1 (RC1), then instantly switched to reaction chamber 2 (RC2), then again instantly switched to reaction chamber 1 (RC1), and repeats this switching. The switching is accomplished by simultaneous operation of valves V1 (M1), V2 (M1). Reactant B is supplied to the reactor to which reactant A is not supplied, so that the inflow to each reactor can always be constant. The switching of the reactors to which reactant B is supplied is accomplished by simultaneous operation of valves V1 (M2), V2 (M2). Valves V1 (M1), V1 (M2), V2 (M1), V2 (M2) are synchronized, and operated simultaneously. By using the above method, the transition time can significantly be reduced or eliminated. A skilled artisan will appreciate that the apparatus includes one or more controller(s) (not shown) programmed or otherwise configured to cause the deposition process described elsewhere herein to be conducted, and the controller(s) are communicated with the valves of the reactors, power sources, pumps, robotics and gas flow controllers or heating systems, as will be appreciated by the skilled artisan.

Figure 17:
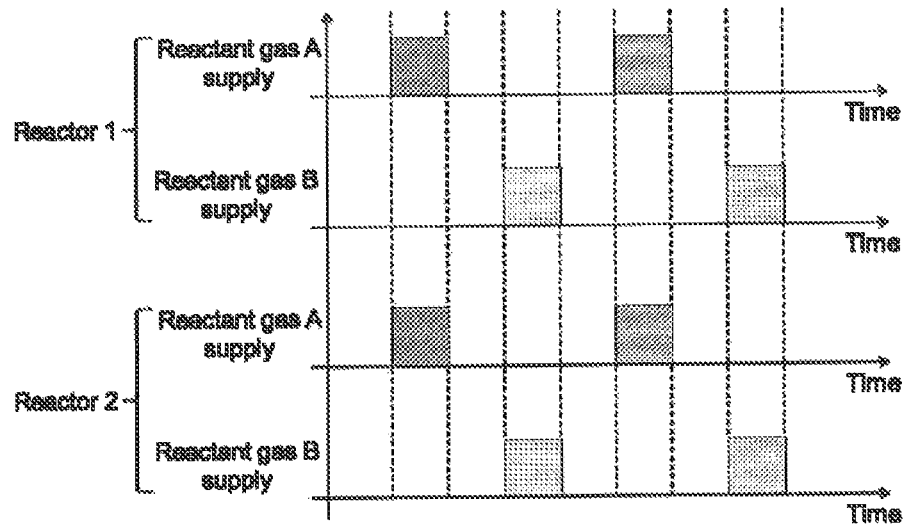
FIG. 17 illustrates a conventional process sequence used for cyclic deposition using two reaction chambers based on concurrent processing.

The sequence of the parallel shift operation illustrated in FIG. 18 can reduce the total gas flow since the transition time is substantially eliminated per deposition cycle. The reduced total gas flow can result in higher partial pressure of reactant or precursor gas so as to obtain a higher surface adsorption rate and high reaction rate in cyclic deposition as compared with a conventional process sequence such as that illustrated in FIG. 17. For example, from chemical reaction kinetics, the reaction rate can be determined as follows:

Reaction rate=$k \times$[reactant A concentration]$^a \times$[reactant B concentration]$^b$, wherein $k$, $a$, $b$=constant.

Reaction constants a, b are determined by each reaction, and k is a function of process temperature. For example, in the case of $N_2$ (g)+$3H_2$ (g)→$2NH_3$ (g), reaction rate k is $[N_2]^a \times [H_2]^b$ (a=11, b=3, k is a temperature dependent constant determined by the arrhenius equation. When the concentrations of reactants are increased, the reaction rate can significantly be increased. Further, from langmuir isotherm, the adsorption rate can be determined as follows:

Adsorption rate ($\theta$)=($\alpha P$)/(1+$\alpha P$), wherein $\alpha$: constant, $P$: partial pressure of adsorbing material.

By increasing partial pressure of reactant or precursor gas, the adsorption rate can also be increased. Accordingly, in some embodiments, the parallel shift operation can bring about advantages over conventional operation, including reducing or eliminating the transition time between different reactant gas supplies, minimizing the total gas flow in the reactor per cycle and increasing partial pressure of precursor or reactant gases so as to increase precursor surface adsorption and reaction rate, using two or more reactant gases, and/or reducing or eliminating pressure change during transition so as to improve process controllability and process stability.

Figure 20:
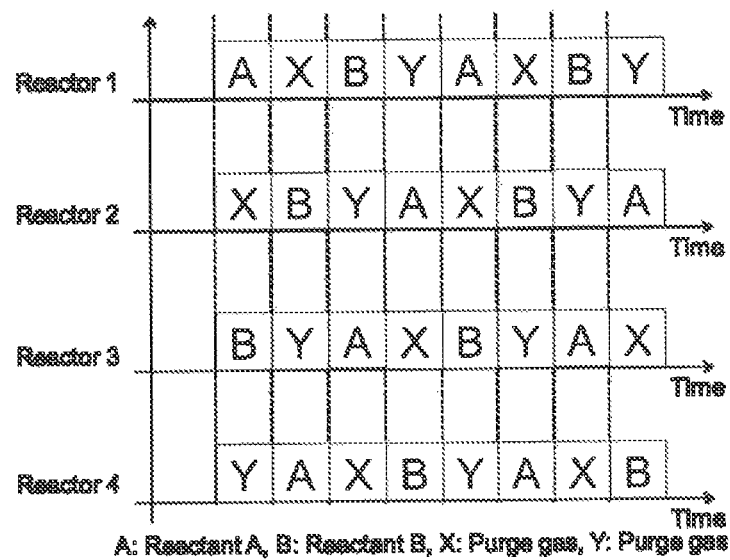
FIG. 20 illustrates process sequences of four reactors using the parallel shift operation, wherein flow of inert gas X, Y separates reactant A and reactant B in each reactor according to an embodiment of the present invention.

If reactant gases should not be mixed in the reactor due to their chemical reactivity, inactive gas can be supplied to separate the reactant gases as illustrated in FIG. 20. FIG. 20 illustrates process sequences of four reactors using the parallel shift operation according to an embodiment, wherein flow of inert gas X, Y separates reactant A and reactant B in each reactor. Reactant A is supplied to reactors 1→4→3→2 in sequence, reactant B is supplied to reactors 3→2→1→4 in sequence, inert gas X is supplied to reactors 2→1→4→3 in sequence, and inert gas Y is supplied to reactors 4→3→2→1 in sequence, simultaneously without interruption.

Figure 21:
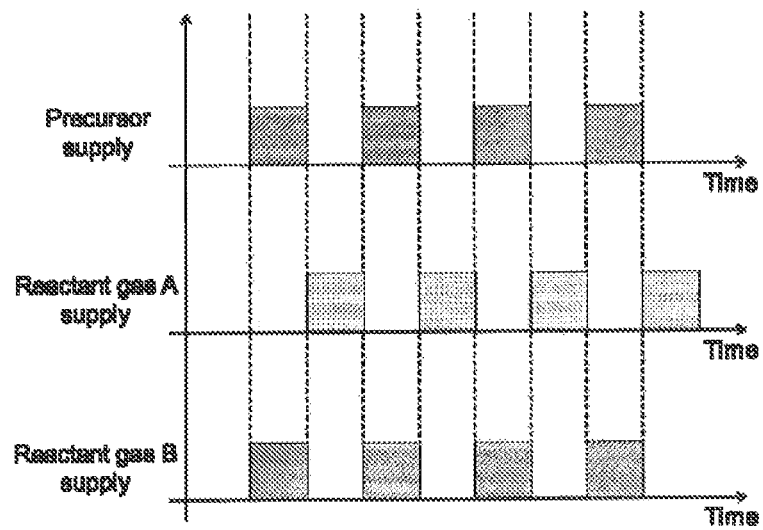
FIG. 21 illustrates a process sequence of a reactor using the parallel shift operation according to an embodiment, wherein when a precursor is supplied, reactant gas B is also supplied, and when the precursor is not supplied, reactant gas A is supplied according to an embodiment.

Also, ambient gas can be independently controlled in combination with precursor supplies as illustrated in FIG. 21. FIG. 21 illustrates a process sequence of one of two reactors using parallel shift operation according to an embodiment, wherein when a precursor such as titanium tetraisopropoxide (TTIP) is supplied, reactant gas B such as $NH_3$ is also supplied for improving adsorption of TTIP, and when the precursor is not supplied, reactant gas A such as $O_2$ is supplied for reaction with TTIP in ALD, according to an embodiment. The process sequence of the second reactor is shifted by one supply unit where when the precursor is supplied in the first reactor, no precursor is supplied in the second reactor, whereas when the precursor is not supplied in the first reactor, the precursor is supplied in the second reactor. In the above, the main line to supply the precursor is capable of switching flow of an inactive gas and flow of the precursor or switching flow of the inactive gas and flow of the mixture of the precursor and the inactive gas without interruption at the same total flow rate, so that the outflow rate of the reactor can be substantially constant.

Figure 5:
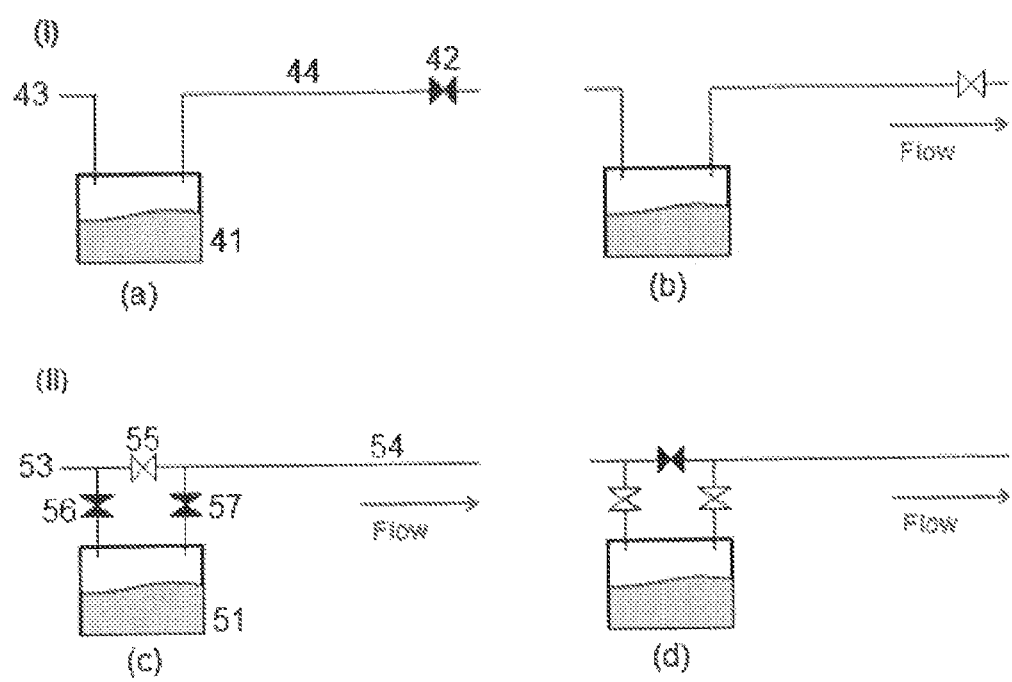
FIG. 5 illustrates a schematic view of an on-off flow control system (I), and a schematic view of a switching flow control system (II).
Figure 6:
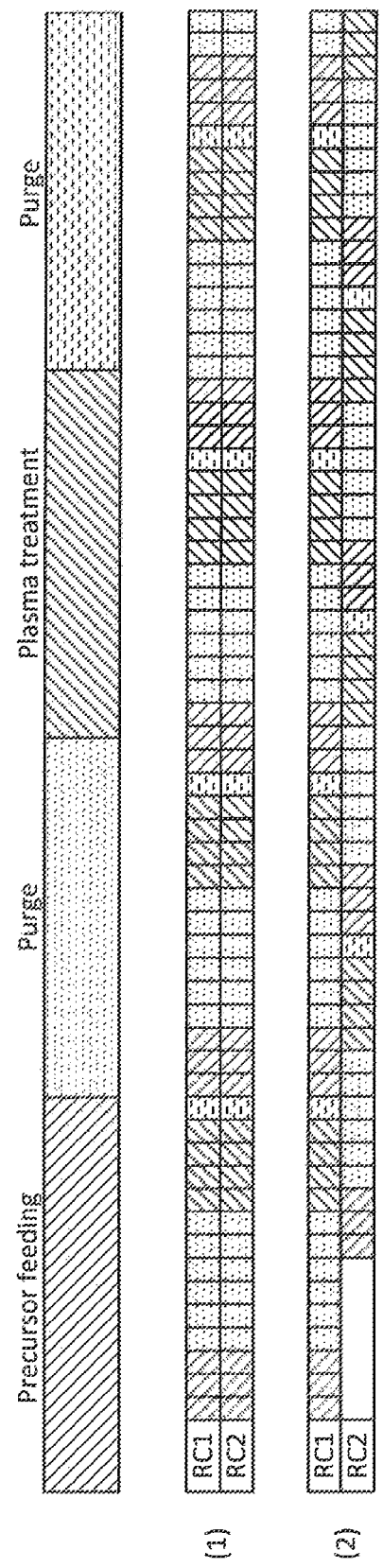
FIG. 6 illustrates a process sequence used for typical PEALD using concurrent processing (1), and a process sequence used for typical PEALD using alternate processing (2).
Figure 7:
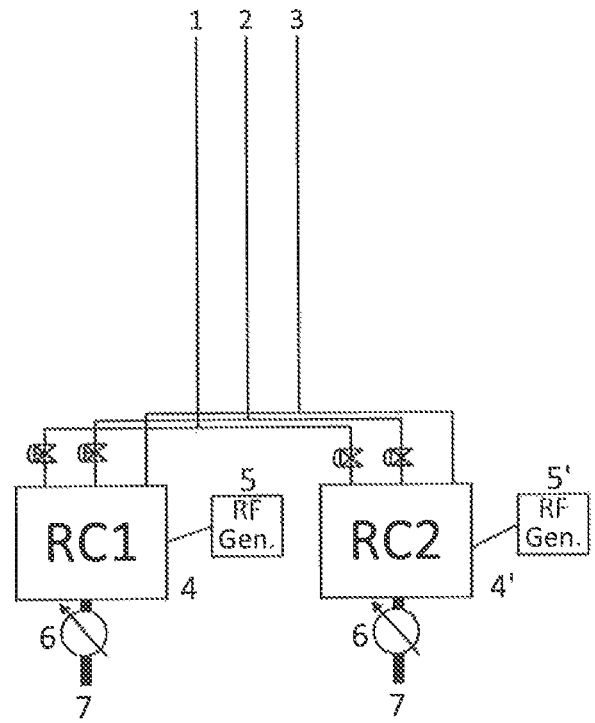
FIG. 7 illustrates a two-reactor system with the on-off flow control system (I), concurrent processing (1), and the capability of different cycles (A).
Figure 8:
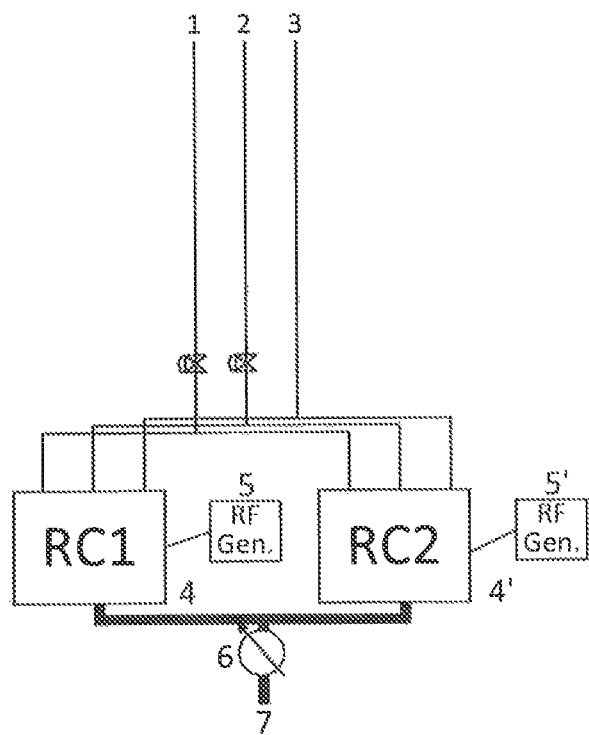
FIG. 8 illustrates a two-reactor system with the on-off flow control system (I), concurrent processing (1), and the incapability of different cycles (B).
Figure 9:
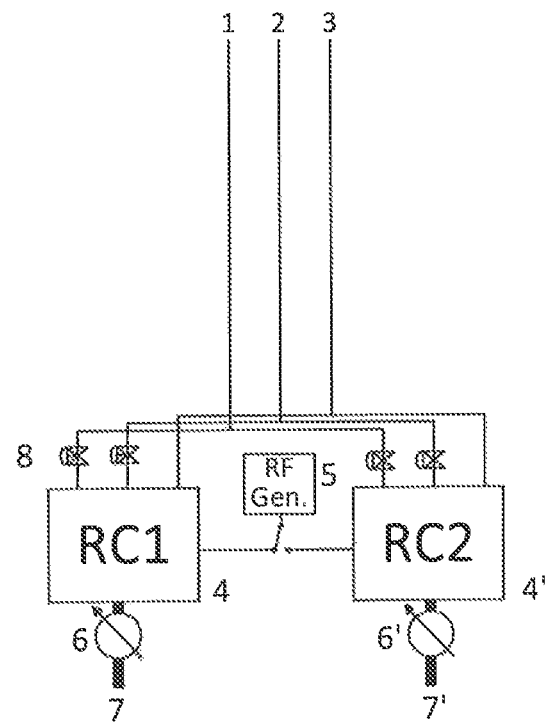
FIG. 9 illustrates a two-reactor system with the on-off flow control system (I) and alternate processing (2).
Figure 10:
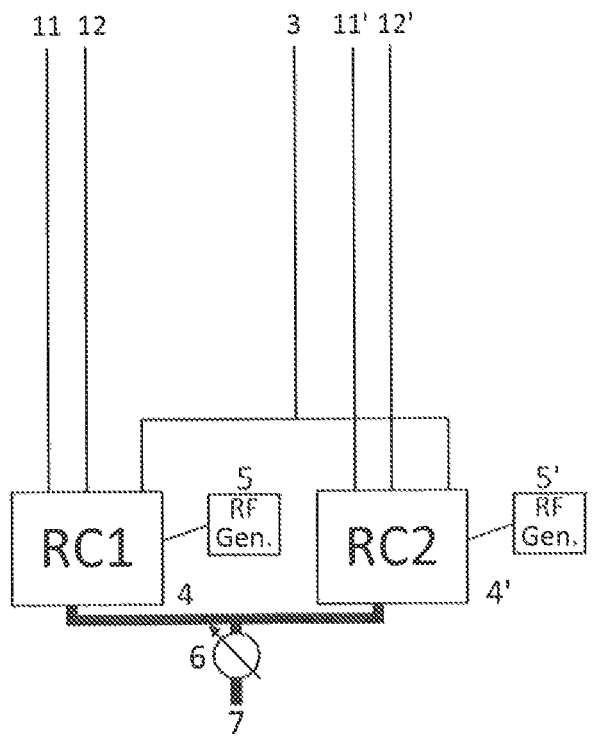
FIG. 10 illustrates a two-reactor system with the switching flow control system (II), concurrent processing (1), and the capability of different cycles (A).
Figure 11:
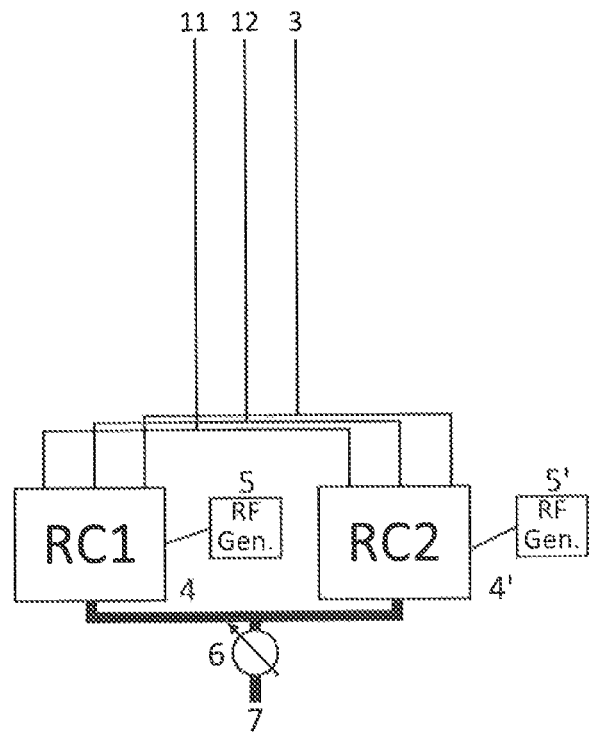
FIG. 11 illustrates a two-reactor system with the switching flow control system (II), concurrent processing (1), and the incapability of different cycles (B).
Figure 12:
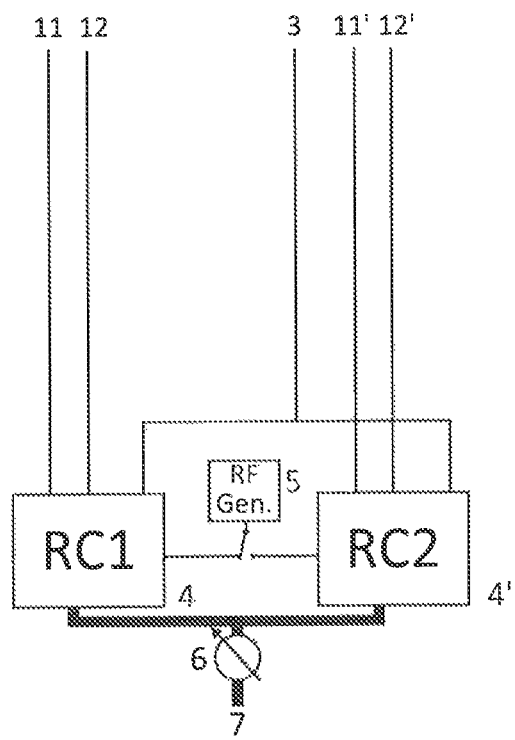
FIG. 12 illustrates a two-reactor system with the switching flow control system (II) and alternate processing (2).
Figures 15, 16:
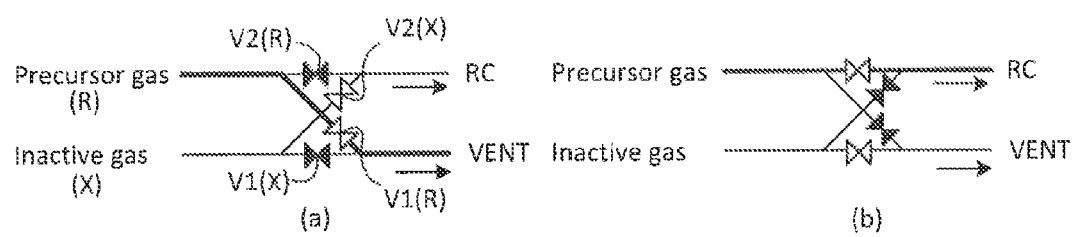
FIG. 15 illustrates process sequences of two reactant gases in ALD without using RF charge according to an embodiment of the present invention.
FIG. 16 illustrates a schematic diagram of switching flow of an inactive gas and flow of a precursor gas according to an embodiment of the present invention.

Thus, in some embodiments, at least one of the n gases is an inactive gas, a reactant gas, or a mixture thereof, and the main gas line for the at least one of the n gases is capable of switching flow of the inactive gas and flow of the reactant gas or switching flow of the inactive gas and flow of the mixture gas without interruption at the same total flow rate. For example, switching flow of an inactive gas and flow of a mixture of a precursor and the inactive gas can be accomplished as illustrated in (II) in FIG. 5 showing a switching flow control system, where the precursor is liquid, and vaporized in the tank 51. Switching flow of an inactive gas and flow of a precursor gas can be accomplished as illustrated in FIG. 16. FIG. 16 illustrates a schematic diagram of switching flow an inactive gas and flow of a precursor gas according to an embodiment. In (a) in FIG. 16, valves V1 (I) and V2 (P) are closed, and valves V1 (P) and V2 (I) are open, so that a precursor gas flows to a vent via valve V (P), and an inactive gas flows to a reactor via valve V2 (I). In (b) in FIG. 16, by simultaneously closing valves V1 (P) and V2 (I) and opening valves V1 (I) and V2 (P), the precursor gas is instantly directed to flow to the vent, and the inactive gas is instantly directed to flow to the reactor, without substantial changes in the flow rate. The vent can be set downstream of an exhaust, for example.

When using the switching flow control system as illustrated in FIGS. 5 and 16, the process sequences shown in FIG.

Figure 19:
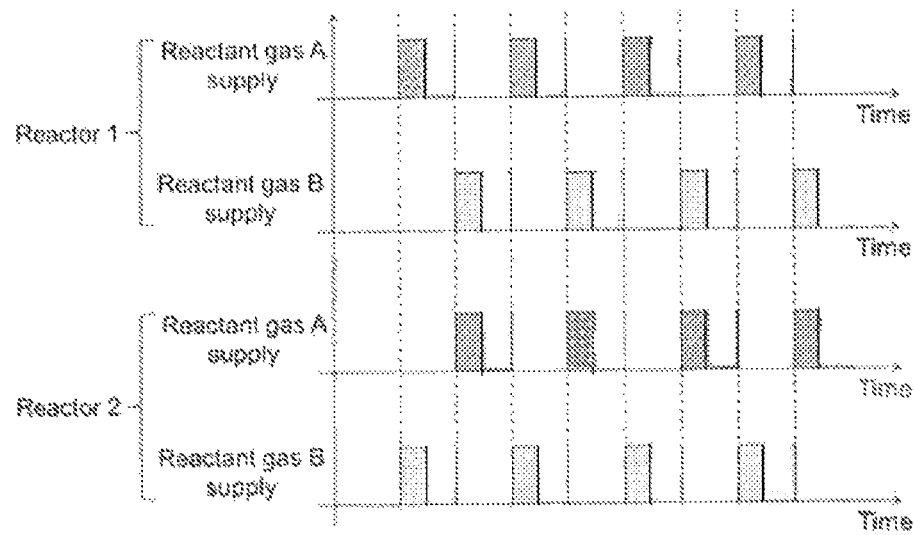
FIG. 19 illustrates process sequences of parallel shift operation in two reactors using a switch flow control system according to an embodiment of the present invention.

18 can be modified to include purge between each reactant gas A pulse and each reactant gas B pulse, as illustrated in FIG. 19.

In some embodiments, n is two, main gas lines 1 and 2 each supply an inactive gas, a reactant gas, or a mixture thereof at the same flow rate, and gas ports 1 and 2 are connected to two reactors as the multiple reactors, respectively. FIG. 13A is a schematic diagram illustrating parallel shift operation of PEALD using two reactors according to an embodiment, where a gas from main gas line M1 (a precursor/inactive gas switching line) flows to reaction chamber RC1 via branch gas line B1-1 through valve V1-1, since valve V1-2 provided in branch gas line B1-2 is closed, and also, a gas from main gas line M2 (a precursor/inactive gas switching line) flows to reaction chamber RC2 via branch gas line B2-2 through valve V2-2, since valve V2-1 provided in branch gas line B2-1 is closed. FIG. 13B is a schematic diagram illustrating the parallel shift operation of PEALD after changing the gases according to an embodiment, where the gas from main gas line M1 (the precursor/inactive gas switching line) flows to reaction chamber RC2 via branch gas line B1-2 through valve V1-2, since valve V1-1 provided in branch gas line B1-1 is closed, and also, the gas from main gas line M2 (the precursor/inactive gas switching line) flows to reaction chamber RC1 via branch gas line B2-1 through valve V2-1, since valve V2-2 provided in branch gas line B2-2 is closed. The above switching of the open state and closed state of each valve is simultaneously operated and synchronized, so as to reduce or eliminate the transition time. This switching constitutes alternate processing between reaction chambers RC1 and RC2. Since alternate processing is used, an RF generator can be shared by reactors RC1 and RC2. Further, since the outflow rate of each reactor is substantially the same, a pressure control valve 6 and an exhaust 7 can be shared by reaction chambers RC1 and RC2. Further, since main gas lines M1 and M2 are of precursor/inactive gas switching type, without changing the flow rate, purging can be done between flow of the two precursor gases.

In some embodiments, a common gas line is provided, which branches into gas lines connected to the multiple reactors, respectively, wherein a common gas is continuously supplied, through the common gas line simultaneously, to the multiple reactors. In FIGS. 13A and 13B, a common gas line C1 is installed to supply, for example, a reactant gas, to both reaction chambers RC1 and RC2 continuously. In some embodiments, the common gas is not reactive to gases 1 to n when they are in a non-excited state.

In some embodiments, the open state and closed state of each valve are controlled as illustrated in FIGS. 25 to 28 in order to achieve parallel shift operation using liquid precursors. FIGS. 25 to 28 are schematic diagrams illustrating parallel shift operation of PEALD by two reactors using liquid precursors according to an embodiment. FIGS. 25 to 28 represent steps corresponding to steps of feeding of reactor RC1, purging, feeding of reactor RC2, and purging, respectively. In the drawings, a valve 102 is provided in a line connected to an inlet of tank T1 storing a liquid precursor; a valve 103 is provided in a line connected to an outlet of tank T1; a valve 108 is provided in a line bypassing tank T2; a valve 110 is provided in a line connected to an inlet of tank T2 storing another liquid precursor; a valve 109 is provided in a line connected to an outlet of tank T2; a valve 108 is provided in a line bypassing tank T2; a valve 104 is provided in a line between the outlet of tank T1 and an inlet of reactor RC1; a valve 105 is provided in a line between the outlet of tank T1 and an inlet of reactor RC2; a valve 107 is provided in a line between the outlet of tank T2 and the inlet of reactor RC2; and a valve 106 is provided in a line between the outlet of tank T2 and the inlet of reactor RC1. An inactive gas is continuously supplied to reactors RC1 and RC2 via shared line C1 at a constant flow rate. In main gas lines M1 and M2, gases are continuously supplied at a constant flow rate (mass flow control (not shown) is also conducted to set the flow at a given constant value). Thus, even when pulsing is conducted to switch corresponding branch gas lines, the inflow rate of reactors RC1 and RC2 and the outflow rate of reactors RC1 and RC2 are always constant. In an embodiment, the open state and closed state of the valves are shown in Table 2 below.

TABLE 2

|  | RC1 feed | Purge | RC2 feed | Purge |
| --- | --- | --- | --- | --- |
| Valve 101 | Closed | Open | Closed | Open |
| Valve 102 | Open | Closed | Open | Closed |
| Valve 103 | Open | Closed | Open | Closed |
| Valve 104 | Open | Open | Closed | Closed |
| Valve 105 | Closed | Closed | Open | Open |
| Valve 106 | Closed | Closed | Open | Open |
| Valve 107 | Open | Open | Closed | Closed |
| Valve 108 | Open | Open | Open | Open |
| Valve 109 | Closed | Closed | Closed | Closed |
| Valve 110 | Closed | Closed | Closed | Closed |

According to the above embodiment and other disclosed embodiments, the pressure of each reactor is substantially unchanged regardless of whether a precursor is supplied thereto or not Further, the pressure of each reactor is substantially unchanged when switching the reactors for a particular precursor. Thus, an exhaust can be shared by the reactors. However, if there are three or more reactors using parallel shift operation, in some embodiments, an exhaust may not be shared by all of the three or more reactors in view of the exhaust capacity, but may be shared by some of the reactors. Further, the pressure difference between the reactors is always substantially zero, and thus, unwanted and unintended flow of a material gas to the reactors through an exhaust line can effectively be inhibited, thereby precisely supplying a material gas to a target reactor.

Further, in the above examples, the precursor is liquid and is vaporized before being supplied to the gas port; however, the precursor can be gaseous without vaporization, and switching the reactant and the precursor can be accomplished as illustrated in FIG. 16.

In some embodiments, n is three, main gas lines 1, 2, and 3 each supply an inactive gas, a reactant gas, or a mixture thereof at the same flow rate, and gas ports 1, 2, and 3 are connected to three reactors as the multiple reactors, respectively. In some embodiments, n is three, main gas lines 1, 2, and 3 each supply an inactive gas, a reactant gas, or a mixture thereof at the same flow rate, and gas ports 1, 2, and 3 are connected to two reactors as the multiple reactors and one vent, respectively. In some embodiments, n is three, main gas line 1 supplies an inactive gas, reactant gas, or a mixture thereof at the same flow rate, main gas lines 2 and 3 each supply an inactive gas, and gas ports 1, 2, and 3 are connected to three reactors as the multiple reactors, respectively. In some embodiments, the n gases are continuously reactant gases. FIGS. 14A to 14D are schematic diagrams illustrating modifications of the parallel shift operation according to some embodiments.

In FIG. 14A, there are two reaction chambers RC1, RC2, and two precursor/inactive gas lines P1, P2. The following process sequences of reaction chambers RC1 and RC2 shown in Table 3 may be employed as an example (P1: precursor 1; P2: precursor 2; RF charge: application of RF power; IA: inactive gas; Line 1: main gas line 1 of precursor/inactive gas switching type; Line 2: main gas line 2 of precursor/inactive gas switching type).

TABLE 3

| | | P1 supply | Purge | P2 supply | Purge | RF charge | Purge | P1 supply | Purge |
|---|---|---|---|---|---|---|---|---|---|
| RC1 | Line 1 | P1 | IA | | | IA | IA | P1 | IA |
| | Line 2 | | | P2 | IA | | | | |
| | | | | P1 supply | Purge | P2 supply | Purge | RF charge | Purge |
| RC2 | Line 1 | | | P1 | IA | | | | |
| | Line 2 | | | | | P2 | IA | IA | IA |

Depending on the process, the order of P1 supply, P2 supply, and RF charge can be changed to P1 supply, RF charge, P2 supply, and RF charge. Further, the ratio of P1 cycle to P2 cycle need not be 1:1.

If only one precursor is used in place of two precursors in the above, the following process sequences of reaction chambers RC1 and RC2 shown in Tables 4 and 5 may be employed as an example:

TABLE 4

| | | P1 supply | Purge | RF charge | Purge | P1 supply | Purge | RF charge | Purge |
|---|---|---|---|---|---|---|---|---|---|
| RC1 | Line 1 | P1 | IA | | | P1 | IA | | |
| | Line 2 | | | IA | IA | | | IA | IA |
| | | | | P1 supply | Purge | RF charge | Purge | P1 supply | Purge |
| RC2 | Line 1 | | | P1 | IA | | | P1 | IA |
| | Line 2 | | | | | IA | IA | | |

TABLE 5

| | | P1 supply | Purge | RF charge | Purge | P1 supply | Purge | RF charge | Purge |
|---|---|---|---|---|---|---|---|---|---|
| RC1 | Line 1 | P1 | | IA | | P1 | | IA | |
| | Line 2 | | IA | | IA | | IA | | IA |
| | | | P1 supply | Purge | RF charge | Purge | P1 supply | Purge | RF charge |
| RC2 | Line 1 | | P1 | | IA | | P1 | | IA |
| | Line 2 | | | IA | | IA | | IA | |

In the above, as long as RF charge does not overlap between reaction chambers RC1 and RC2, step duration, time lag, the number of cycles, etc. can be modified.

In FIG. 14B, there are two reaction chambers RC1, RC2, and three precursor/inactive gas lines P1, P2, P3. The following process sequences of reaction chambers RC1 and RC2 shown in Table 6 may be employed as an example.

TABLE 6

| | | P1 supply | Purge | P2 supply | Purge | P3 supply | Purge | RF charge | Purge |
|---|---|---|---|---|---|---|---|---|---|
| RC1 | Line 1 | P1 | IA | | | | | IA | IA |
| | Line 2 | | | P2 | IA | | | | |
| | Line 3 | | | | | P3 | IA | | |
| | | | | P1 supply | Purge | P2 supply | Purge | P3 supply | Purge |
| RC2 | Line 1 | | | P1 | IA | | | | |
| | Line 2 | | | | | P2 | IA | | |
| | Line 3 | | | | | | | P3 | IA |

TABLE 6-continued

|   |   |   |   |   |   | P1 supply | Purge | P2 supply | Purge |
|---|---|---|---|---|---|---|---|---|---|
| RC3 | Line 1 |   |   |   |   | P1 | IA |   |   |
|   | Line 2 |   |   |   |   |   |   | P2 | IA |
|   | Line 3 |   |   |   |   |   |   |   |   |

|   |   | P1 supply | Purge | P2 supply | Purge | P3 supply | Purge | RF charge | Purge |
|---|---|---|---|---|---|---|---|---|---|
| RC1 | Line 1 | P1 | IA |   |   |   |   | IA | IA |
|   | Line 2 |   |   | P2 | IA |   |   |   |   |
|   | Line 3 |   |   |   |   | P3 | IA |   |   |

|   |   | RF charge | Purge | P1 supply | Purge | P2 supply | Purge | P3 supply | Purge |
|---|---|---|---|---|---|---|---|---|---|
| RC2 | Line 1 |   |   | P1 | IA |   |   |   |   |
|   | Line 2 | IA | IA |   |   | P2 | IA |   |   |
|   | Line 3 |   |   |   |   |   |   | P3 | IA |

|   |   | P3 supply | Purge | RF charge | Purge | P1 supply | Purge | P2 supply | Purge |
|---|---|---|---|---|---|---|---|---|---|
| RC3 | Line 1 |   |   |   |   | P1 | IA |   |   |
|   | Line 2 |   |   |   |   |   |   | P2 | IA |
|   | Line 3 | P3 | IA | IA | IA |   |   |   |   |

Depending on the process, the timing of RF charge can be changed after each of the precursor supplies, and also as long as RF charge does not overlap between reaction chambers RC1 and RC2, step duration, time lag, the number of cycles, etc. can be modified.

In FIG. 14C, there are two reaction chambers RC1, RC2, and three precursor/inactive gas lines P1, P2, P3 as in FIG. 14B. However, in place of reaction chambers RC3, a vent is used. For example, the vent is not connected to a reactor and set downstream of an exhaust so that the flow to the vent does not affect the pressure in the reactor(s) and can be discharged. The process sequences of reaction chambers RC1 and RC2 may be similar to those in FIG. 14B.

Figure 30:
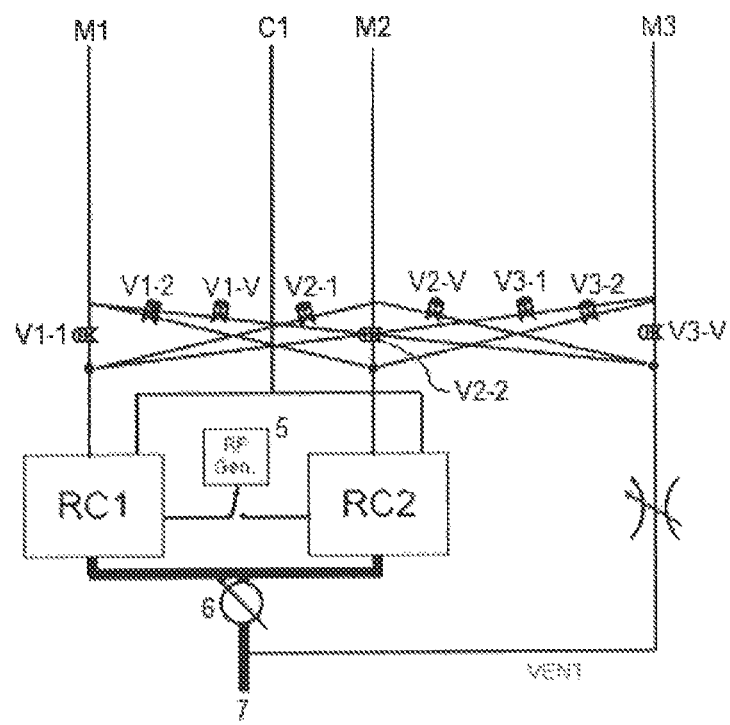
FIG. 30 is a schematic diagram illustrating a system of parallel shift operation where there is a vent provided in addition to reaction chambers RC1 and RC2, according to an embodiment of the present invention.

FIG. 30 is a schematic diagram illustrating a system of parallel shift operation where there is a vent provided in addition to reaction chambers RC1 and RC2, according to an embodiment. The vent is set downstream of an exhaust 7 and is not connected to a reactor. There are three main gas lines M1, M2, and M3 of the switching flow control type, and one common line C1. Gas from main gas line M1 flows to one of reaction chambers RC1 and RC2 and the vent by controlling valves V1-1, V1-2, and V1-V, respectively. Gas from main gas line M2 flows to one of reactors RC1 and RC2 and the vent by controlling valves V2-1, V2-2, and V2-V, respectively. Gas from main gas line M3 flows to one of reaction chambers RC1 and RC2 and the vent by controlling valves V3-1, V3-2, and V3-V, respectively. The valves are simultaneously controlled and synchronized so that reaction chambers RC and RC2 and the vent always receive different gases changing in sequence without interruption. Since the vent is provided, the number of cycles can be set to each reactor differently. In the case that there is a difference between conductance of gas flow passing through reaction chambers RC1 and RC2 and conductance of gas passing through the vent, the flow rate may fluctuate if a mass flow control (MFC) cannot compensate for the difference. In some embodiments, in order to inhibit fluctuation, a needle valve or the like can be used to adjust the conductance of gas passing through the vent so as to correspond to that of gas passing through reaction chambers RC1 and RC2.

In FIG. 14D, there are two reaction chambers RC1, RC2, RC3, one precursor/inactive gas line P1, and two inactive gas lines IA1, IA2. The following process sequences of reaction chambers RC1 and RC2 shown in Table 7 may be employed as an example.

TABLE 7

|   |   | P1 supply | Purge | RF charge | Purge | P1 supply | Purge | RF charge | Purge |
|---|---|---|---|---|---|---|---|---|---|
| RC1 | Line 1 | P1 |   |   |   | IA | P1 |   |   | IA |
|   | Line 2 |   | IA1 |   |   |   |   | IA1 |   |   |
|   | Line 3 |   |   |   | IA2 |   |   |   | IA2 |   |

|   |   | P1 supply | Purge | RF charge | Purge | P1 supply | Purge | RF charge |
|---|---|---|---|---|---|---|---|---|
| RC2 | Line 1 | P1 |   |   |   | P1 |   |   |
|   | Line 2 |   | IA1 |   |   |   | IA1 |   | IA1 |
|   | Line 3 |   |   |   | IA2 |   |   |   | IA2 |

|   |   | P1 supply | Purge | RF charge | Purge | P1 supply | Purge |
|---|---|---|---|---|---|---|---|
| RC3 | Line 1 | P1 |   |   |   | P1 |   |
|   | Line 2 |   | IA1 |   |   |   | IA1 |
|   | Line 3 |   |   | IA2 | IA2 |   |   |

Depending on the process, also as long as RF charge does not overlap between reaction chambers RC1 and RC2, step duration, time lag, the number of cycles, etc. can be modified.

Figure 29:
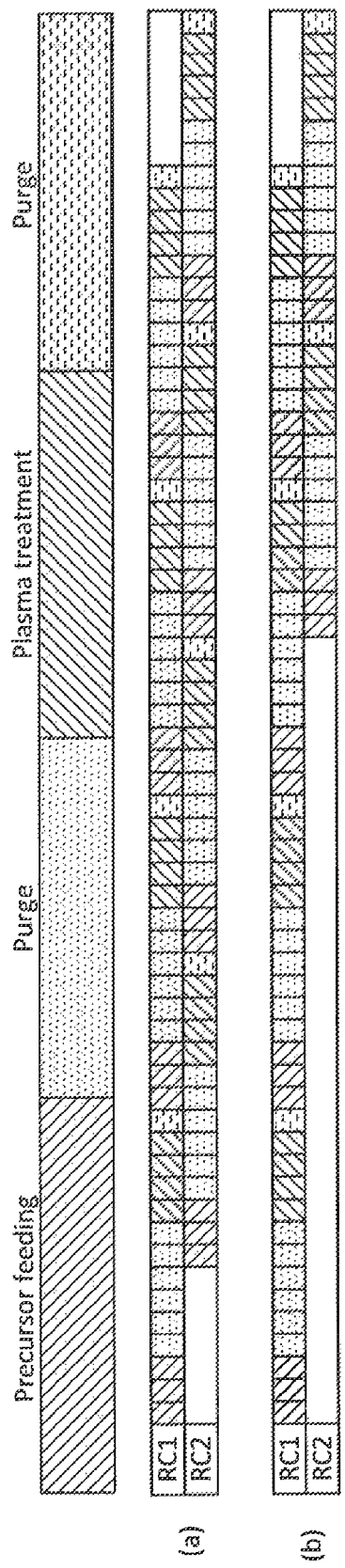
FIG. 29 illustrates process sequences of parallel shift operation using two reactors with different cycles according to an embodiment of the present invention.

In the above, PEALD processes are used as examples. However, other cyclic deposition such as thermal or radical-enhanced ALD can be performed in a manner similar to PEALD, as illustrated in FIG. 15 which shows process sequences of reactant gas 1 and reactant gas 2 according to an embodiment. The process sequence of a precursor is omitted, but it is similar to that shown in FIG. 21. Some embodiments are characterized by at least two features: Gas supply lines and an exhaust line can be shared, and deposition cycles can be set for each reactor independently of each other. For example, FIG. 29 illustrates process sequences of parallel shift operation using two reactors with different cycles according to an embodiment. In (a) in FIG. 29, both reaction chambers RC1 and RC2 run four cycles, and in (b) in FIG. 29, reactor RC1 runs four cycles whereas reaction chamber RC2 runs two cycles. In the figure, one unit represents 0.1 second. While no cycle is conducted in reaction chambers RC1 and RC2, only inactive gas flows therethrough in the same manner as in the purge steps. In PEALD processes, as described above, an RF generator can be shared in some embodiments. However, when the duration of RF charge is long, and/or when the number of gas lines and the number of reactors are high, it may be better to install an RF generator to each reactor so as to inhibit lowering process throughput.

In some embodiments, gases 1 to n are not reactive to each other when they are in a non-excited state. In some embodiments, the type of gas which can be supplied in main gas line M1, main gas line M2, and main gas line C1 shown in FIG. 13A, for example, are shown in Table 8 below when the switching flow control system is used:

TABLE 8

| Reactivity between gases without plasma | C1 | M1 | M2 |
|---|---|---|---|
| Non reactive | Reactant 3 | Reactant 1 (Precursor 1) | Reactant 2 (Precursor 2) |
|  | Reactant 3 | Reactant 1 (Precursor 1) | Inactive |
| Reactive | Inactive gas | Reactant 1 (Precursor 1) | Reactant 2 (Precursor 2) |
|  | Inactive gas | Reactant 1 (Precursor 1) | Inactive gas |

As described above, in some embodiments, another main gas line is provided, which branches into branch gas lines connected to the multiple reactors, respectively, each branch gas line being provided with a valve for closing and opening the branch gas line, wherein another reactant gas is supplied to the multiple reactors in sequence by (a) continuously supplying the other reactant gas to the other main gas lines; (b) during step (a), supplying the other reactant gas to one of the multiple reactors via the branch gas line connected thereto, wherein the valves of the branch gas lines are in an open state, and the valves of the other branch gas lines are in a closed state; (c) during step (a) and after step (b), simultaneously closing the valves of the branch gas lines in the open state and opening the valve of another of the branch gas lines in the closed state, thereby supplying the other reactant gas to another of the multiple reactors connected to the other branch gas line; and (d) repeating step (c) in sequence.

In some embodiments, the other main gas line supplies an inactive gas, the other reactant gas, or a mixture thereof, and the other main gas line is capable of switching the inactive gas and the other reactant gas or switching the inactive gas and the mixture gas without interruption at the same total flow rate.

Figure 24:
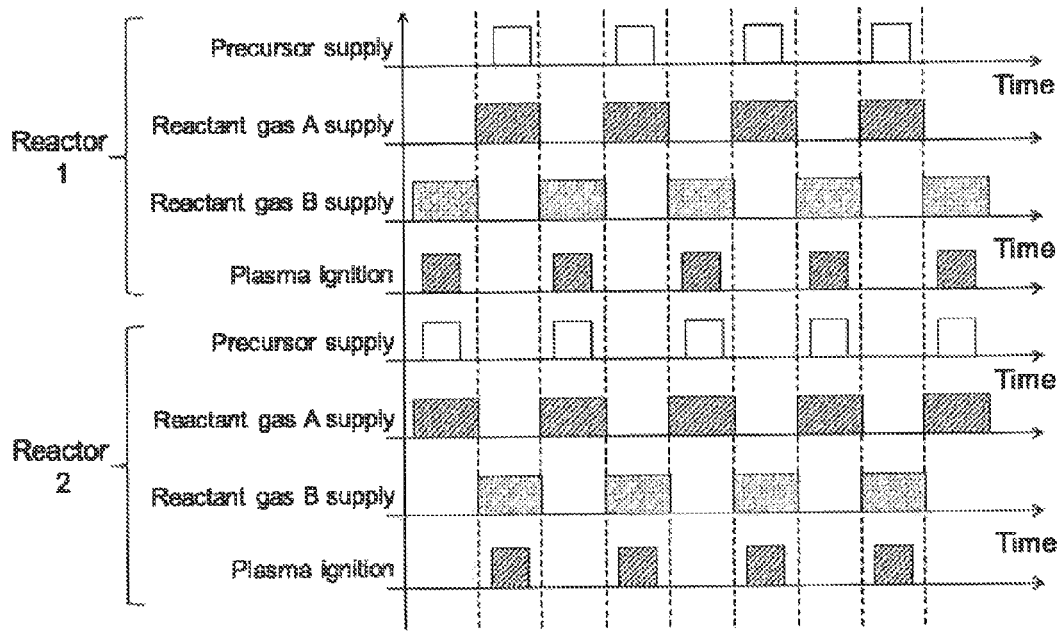
FIG. 24 illustrates process sequences of parallel shift operation of PEALD using two reactors according to an embodiment.
Figure 25:
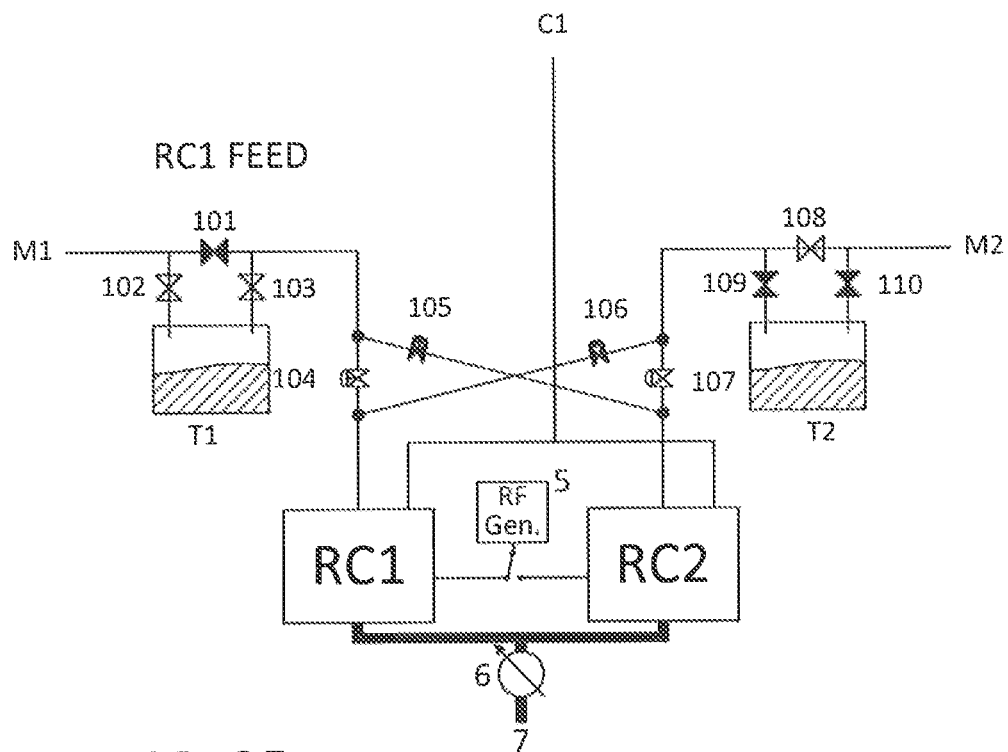
FIGS. 25 to 28 are schematic diagrams illustrating parallel shift operation of PEALD by two reactors using liquid precursors according to an embodiment.
Figure 26:
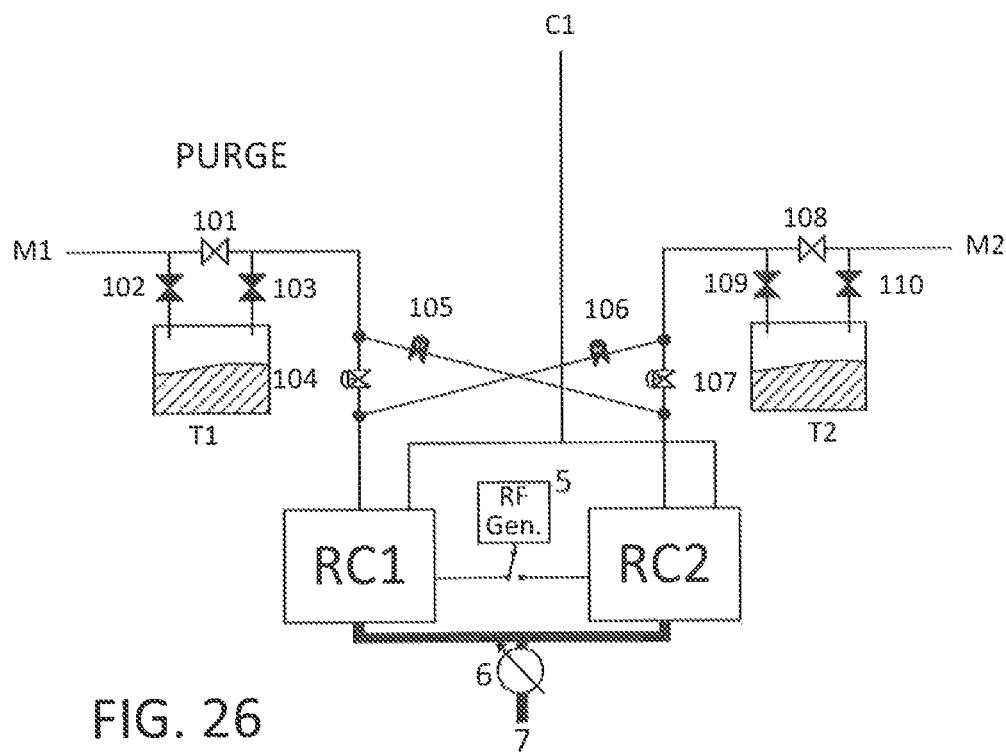
Figure 27:
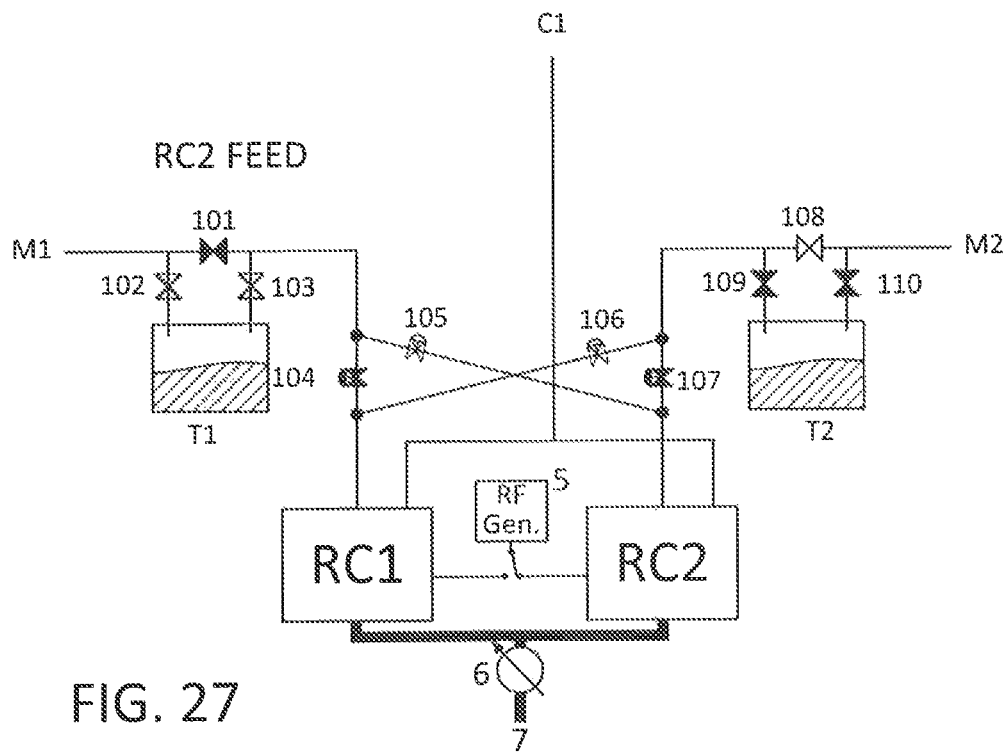
Figure 28:
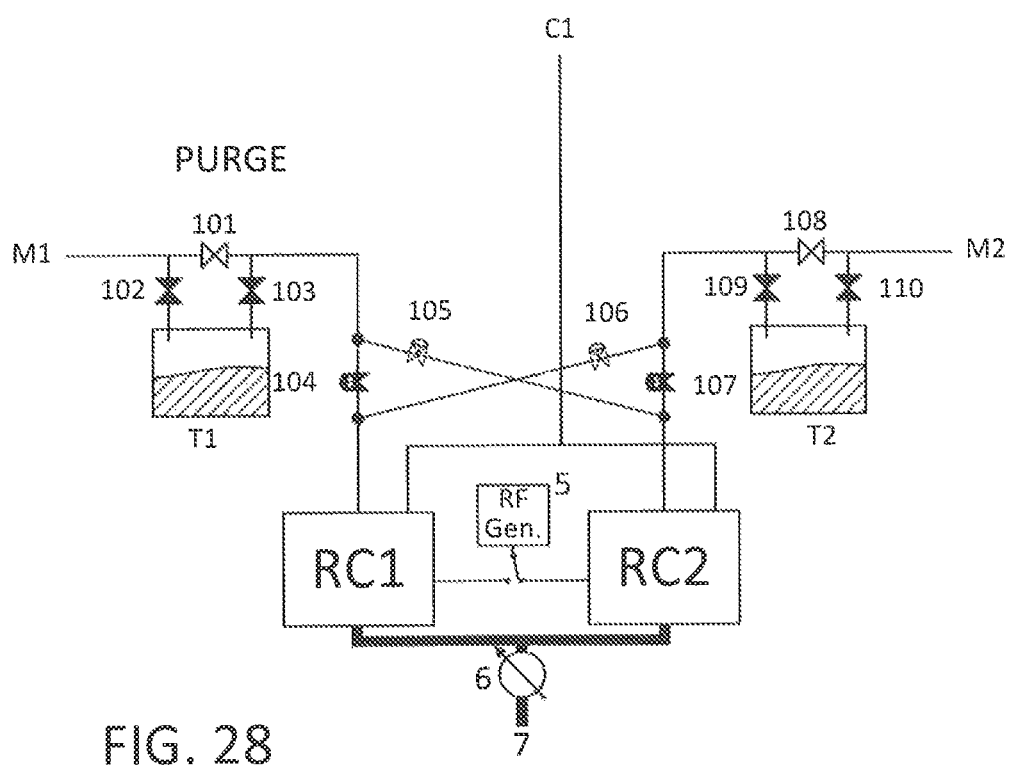

FIG. 24 illustrates process sequences of parallel shift operation of PEALD using two reactors according to an embodiment. If a precursor is supplied through a main gas line of the switching flow control type, the outflow rate of each reactor is substantially constant and the same, and a common pressure control valve and a common exhaust can be used. If a precursor is supplied through a main gas line of the on-off flow control type, the outflow rate of each reactor fluctuates and the timing of fluctuation is different between the reactors. However, the advantage that the transition time of reactant gases can be significantly reduced or eliminated can effectively be obtained. This embodiment can apply to PEALD for SiO film using $NH_3$. For example, $NH_3$ gas is known not only for promoting SiO ALD precursor adsorption, but also for inhibiting oxidation during plasma ignition. To maximize a growth rate gain, precursor supply needs to be done in a $NH_3$ atmosphere, and plasma ignition needs to be done in a $NH_3$ free atmosphere. In the above embodiment, process time loss can be reduced, and process gain can be increased.

The disclosed embodiments include, but are not limited to, a method of parallel shift operation of at least two reactors, wherein n main gas lines numbered 1 to n and n gas ports numbered 1 to n are provided wherein n is an integer greater than one, each main gas line branching into n branch gas lines numbered 1 to n connected to the n gas ports, respectively, each branch gas line being provided with a valve for closing and opening the branch gas line, each reactor being connected to a different gas port, said method comprising:
 (i) continuously supplying n gases numbered 1 to n simultaneously to the n main gas lines, respectively;
 (ii) during step (i), supplying gases 1 to n to gas ports 1 to n, respectively, via branch gas lines 1 to n corresponding to main gas lines 1 to n, respectively, wherein the valves of branch gas lines 1 to n corresponding to main gas lines 1 to n, respectively, are in an open state, and the valves of the other branch gas lines are in a closed state;
 (iii) during step (i) and after step (ii), simultaneously closing the valve of branch gas lines 1 to n in the open state and opening the valves of branch gas lines 1 to n in the closed state corresponding to the next numbered main gas lines, respectively, thereby supplying the next numbered gases to gas ports 1 to n, respectively, wherein the next number after number n returns to number 1; and
 (iv) repeating step (iii), whereby the reactors are operated in parallel by supplying gases in shifted sequences to the respective reactors.

In the above embodiment, "shifted sequences" include sequences with different cycles between the reactors. Further, in the above embodiment, any modifications explicitly, implicitly, necessarily, or inherently disclosed herein can be applied.

In another aspect, some embodiments provide a semiconductor-processing apparatus comprising: (a) multiple reactors; (b) n main gas lines numbered 1 to n and n gas ports numbered 1 to n, wherein n is an integer greater than one, each main gas line branches into n branch gas lines numbered 1 to n connected to the n gas ports, respectively, each branch gas line is provided with a valve for closing and opening the branch gas line, and each reactor is connected to a different gas port, wherein one of branch gas lines 1 to n of each main gas line is in an open state at a time while all the other branch gas lines of the main gas line are in a closed state; and (c) a common exhaust shared by the reactors, wherein the valves of the branch gas lines are programmed to (i) continuously supply n gases numbered 1 to n simultaneously to the n gas ports via the n main gas lines, respectively, at a constant flow rate, wherein one of the branch gas lines of each main gas line is in an open state so that the inflow rates of the respective reactors are equal, and the outflow rates of the respective reactors are equal; and (ii) while maintaining the inflow rates and the outflow rates of the respective reactors, simultaneously close the one of the branch gas lines of each main gas line in the open state and open another one of the branch gas lines of each main gas line so that different numbered gases are continuously supplied to the respective reactors in parallel without changing the inflow rates and the outflow rates of the reactors.

A skilled artisan can readily modify the above apparatus to perform any of the methods disclosed in the present disclosure based on routine work.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method of parallel shift operation of multiple reactors in which substrates are placed for processing, wherein n main gas lines numbered 1 to n and n gas ports numbered 1 to n for each main gas line are provided wherein n is an integer greater than one, each main gas line branches into n branch gas lines numbered 1 to n connected to the n gas ports, respectively, each branch gas line is provided with a valve for closing and opening the branch gas line, and each reactor is connected to a different gas ports, wherein one of branch gas lines 1 to n of each main gas line is in an open state at a time while alt the other branch gas lines of the main gas lines are in a closed state, said method comprising:
(i) continuously supplying n gases numbered 1 to n simultaneously to the n gas ports via the n main gas lines, respectively, at a constant flow rate, wherein one of the branch gas lines of each main gas line is in an open state, said one of the branch gas lines being such that the inflow rates of the respective reactors are equal, and the outflow rates of the respective reactors are equal; and
(ii) while maintaining the inflow rates and the outflow rates of the respective reactors, simultaneously closing the one of the branch gas lines of each main gas line in the open state and opening another one of the branch gas lines of each main gas line so that each numbered gas is continuously supplied to different reactors in sequence wherein all of the numbered gases are switched by the valves from one reactor to another simultaneously through the processing of the substrates without changing the inflow rates and the outflow rates of the reactors,
further comprising switching gases constituting at least one of the numbered gases flowing through the main gas line upstream of the branch gas lines without interruption at the same total flow rate during step (i), where said switching of gases is synchronized to the switching of the numbered gases.

2. The method according to claim 1, further comprising repeating step (ii) in sequence.

3. The method according to claim 1, wherein in step (i), the branch gas lines in the open state are branch gas lines 1 to n corresponding to main gas lines 1 to n, respectively, and in step (ii), the branch gas lines to be opened are the next numbered branch gas lines corresponding to main gas lines 1 to n, respectively, wherein the next number after number n returns to number 1.

4. The method according to claim 1, wherein at least one of the n gases is an inactive gas, a reactant gas, or a mixture thereof flowing through the main gas line therefor, wherein the at least one of the n gases flowing through the main gas line is switched between the inactive gas and the reactant gas or between the inactive gas and the mixture gas without interruption at the same total flow rate during step (i).

5. The method according to claim 4, wherein n is two, main gas lines 1 and 2 each supply an inactive gas, reactant gas, or a mixture thereof at the same flow rate, and gas ports 1 and 2 are connected to two reactors as the multiple reactors, respectively.

6. The method according to claim 4, wherein n is three, main gas lines 1, 2, and 3 each supply an inactive gas, as reactant gas, or a mixture thereof at the same flow rate, and gas ports 1, 2, and 3 are connected to three reactors as the multiple reactors, respectively.

7. The method according to claim 4, wherein n is three, main gas lines 1, 2, and 3 each supply an inactive gas, a reactant gas, or a mixture thereof at the same flow rate, and gas ports 1, 2, and 3 are connected to two reactors as the multiple reactors and one vent, respectively.

8. The method according to claim 4, wherein n is three, main gas line 1 supplies an inactive gas, a reactant gas, or a mixture thereof at the same flow rate; main gas lines 2 and 3 each supply an inactive gas, and gas ports 1, 2, and 3 are connected to three reactors as the multiple reactors, respectively.

9. The method according to claim 4, wherein the at least one main gas line supplies an inactive gas or a reactant gas with an inactive gas, said reactant gas being a vaporized gas of a liquid material.

10. The method according to claim 4, wherein the at least one main gas line supplies an inactive gas or a reactant gas.

11. The method according to claim 1, wherein a common gas line is provided, which branches into gas lines connected to the multiple reactors, respectively, wherein a common gas is continuously supplied, through the common gas line simultaneously, to the multiple reactors.

12. The method according to claim 11, wherein the common gas is not reactive to gases 1 to n when they are in a non-excited state.

13. The method according to claim 1, wherein gases 1 to n are not reactive to each other when they are in a non-excited state.

14. The method according to claim 1, wherein a common exhaust is provided, into which exhausts from the multiple reactors are merged.

15. The method according to claim 1, wherein the operation of the multiple reactors is cyclic CVD or ALD.

16. The method according to claim 1, wherein the n gases are continuously reactant gases.

17. The method according to claim 16, wherein another main gas line is provided, which branches into branch gas lines connected to the multiple reactors, respectively, each branch gas line being provided with a valve for closing and opening the branch gas line, wherein another reactant gas is supplied to the multiple reactors in sequence by (a) continuously supplying the other reactant gas to the other main gas lines; (b) during step (a), supplying the other reactant gas to one of the multiple reactors via the branch gas line connected thereto, wherein the valves of the branch gas lines are in an open state, and the valves of the other branch gas lines are in a closed state; (c) during step (a) and after step (b), simultaneously closing the valves of the branch gas lines in the open state and opening the valve of another of the branch gas lines in the closed state, thereby supplying the other reactant gas to another of the multiple reactors connected to the other branch gas line; and (d) repeating step (c) in sequence.

18. The method according to claim 17, wherein the other main gas line supplies another gas which is an inactive gas, the other reactant gas, or a mixture thereof, and the another gas flowing through the other main gas line is switched between the inactive gas and the reactant gas or between the inactive gas and the mixture gas without interruption at the same total flow rate during step (a).

19. The method according to claim 1, further comprising applying RF power to the respective reactors in a predetermined sequence while maintaining the inflow rates and the outflow rates of the respective reactors.

* * * * *